United States Patent
Taniguchi et al.

(10) Patent No.: US 10,425,058 B2
(45) Date of Patent: Sep. 24, 2019

(54) ELASTIC WAVE DEVICE

(71) Applicant: Murata Manufacturing Co., Ltd., Nagaokakyo-shi, Kyoto-fu (JP)

(72) Inventors: Yasumasa Taniguchi, Nagaokakyo (JP); Masakazu Mimura, Nagaokakyo (JP); Daisuke Tamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 466 days.

(21) Appl. No.: 15/244,102

(22) Filed: Aug. 23, 2016

(65) Prior Publication Data
US 2016/0359468 A1    Dec. 8, 2016

Related U.S. Application Data

(63) Continuation of application No. PCT/JP2015/056373, filed on Mar. 4, 2015.

(30) Foreign Application Priority Data

Mar. 31, 2014   (JP) .................. 2014-071089

(51) Int. Cl.
*H03H 9/02* (2006.01)
*H03H 9/145* (2006.01)

(52) U.S. Cl.
CPC .... *H03H 9/02921* (2013.01); *H03H 9/02574* (2013.01); *H03H 9/02637* (2013.01); *H03H 9/14541* (2013.01)

(58) Field of Classification Search
CPC .......... H03H 9/02921; H03H 9/14541; H03H 9/02637

USPC ......................................................... 310/313
See application file for complete search history.

(56) References Cited

U.S. PATENT DOCUMENTS

| | | | | |
|---|---|---|---|---|
| 4,037,176 A | * | 7/1977 | Ono ................... | H03H 9/02574 310/313 B |
| 5,838,090 A | * | 11/1998 | Nakahata ........... | H03H 9/02582 310/313 A |
| 8,736,141 B2 | * | 5/2014 | Iwamoto ............... | H01L 41/053 310/313 R |
| 2004/0095038 A1 | * | 5/2004 | Takase ..................... | H03H 3/08 310/313 R |
| 2006/0170521 A1 | | 8/2006 | Shibata | |

(Continued)

FOREIGN PATENT DOCUMENTS

| | | | |
|---|---|---|---|
| JP | 2005065050 A | * | 3/2005 |
| JP | 2010-186861 A | | 8/2010 |
| JP | 2012-169707 A | | 9/2012 |

(Continued)

OTHER PUBLICATIONS

Official Communication issued in corresponding International Application PCT/JP2015/056373, dated Apr. 21, 2015.

*Primary Examiner* — J. San Martin
(74) *Attorney, Agent, or Firm* — Keating & Bennett, LLP

(57) ABSTRACT

An elastic wave device includes a piezoelectric substrate, a first dielectric film disposed on the piezoelectric substrate, and an IDT electrode laminated on the first dielectric film. The resistivity of the piezoelectric substrate is equal to or lower than the resistivity of the first dielectric film. The resistivity of the first dielectric film is equal to or lower than about $1\times10^{14}$ Ω·cm.

18 Claims, 3 Drawing Sheets

(56) References Cited

U.S. PATENT DOCUMENTS

2008/0067891 A1* 3/2008 Matsuda .............. H03H 9/0057
                                                              310/313 R
2012/0200371 A1    8/2012 Yamashita

FOREIGN PATENT DOCUMENTS

WO    2005/091500 A1    9/2005
WO    2014/034222 A1    3/2014

* cited by examiner

ELASTIC WAVE DEVICE

CROSS REFERENCE TO RELATED APPLICATIONS

This application claims the benefit of priority to Japanese Patent Application 2014-071089 filed Mar. 31, 2014 and is a Continuation Application of PCT/JP2015/056373 filed on Mar. 4, 2015, the entire contents of each application are hereby incorporated herein by reference.

BACKGROUND OF THE INVENTION

1. Field of the Invention

The present invention relates to an elastic wave device in which a dielectric film is arranged between a piezoelectric substrate and an interdigital transducer (IDT) electrode.

2. Description of the Related Art

Elastic wave devices have been widely used as resonators and bandpass filters.

One example disclosed in Japanese Unexamined Patent Application Publication No. 2012-169707 below is an elastic wave device including a piezoelectric substrate, a dielectric layer disposed on the piezoelectric substrate, and first and second IDT electrodes laminated on the dielectric layer. In Japanese Unexamined Patent Application Publication No. 2012-169707, the electromechanical coupling coefficient of a used elastic wave is adjusted by changing the thickness of the dielectric layer disposed below each of the first and second IDT electrodes.

In the configuration of the elastic wave device in Japanese Unexamined Patent Application Publication No. 2012-169707, if static electricity generated by charging by friction or the like is applied to the IDT electrodes in a manufacturing step, a potential difference between the neighboring electrode fingers in the IDT electrodes is significantly large. This may result in electrostatic breakdown of the IDT electrodes.

SUMMARY OF THE INVENTION

Preferred embodiments of the present invention provide an elastic wave device less likely to suffer electrostatic breakdown caused by static electricity.

An elastic wave device according to a preferred embodiment of the present invention includes a piezoelectric substrate, a first dielectric film disposed on the piezoelectric substrate, and an interdigital transducer (IDT) electrode laminated on the first dielectric film. Resistivity of the piezoelectric substrate is equal to or lower than resistivity of the first dielectric film, and the resistivity of the first dielectric film is equal to or lower than about $1 \times 10^{14}$ Ω·cm.

In a specific aspect of an elastic wave device according to a preferred embodiment of the present invention, it may further include a second dielectric film that covers a periphery of the IDT electrode. Preferably, the resistivity of the first dielectric film may be lower than resistivity of the second dielectric film.

In another specific aspect of an elastic wave device according to a preferred embodiment of the present invention, the first dielectric film may be disposed only directly under the IDT electrode.

In yet another specific aspect of an elastic wave device according to a preferred embodiment of the present invention, the first dielectric film may be doped with an impurity.

In still another specific aspect of an elastic wave device according to a preferred embodiment of the present invention, the impurity may be boron or phosphorus.

In another specific aspect of an elastic wave device according to a preferred embodiment of the present invention, the first dielectric film may be made of a material in which a material of the second dielectric film is doped with the impurity.

In yet another specific aspect of an elastic wave device according to a preferred embodiment of the present invention, the piezoelectric substrate may be subjected to a reduction process.

According to elastic wave devices of various preferred embodiments of the present invention, if static electricity is applied thereto, electrostatic breakdown is less likely to occur in the IDT electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is clarified below by describing concrete preferred embodiments of the present invention with reference to the drawings. The preferred embodiments described in the specification are merely illustrative and not limiting, and it is noted that configurations can be partially replaced or combined between different preferred embodiments.

Figure 1A:
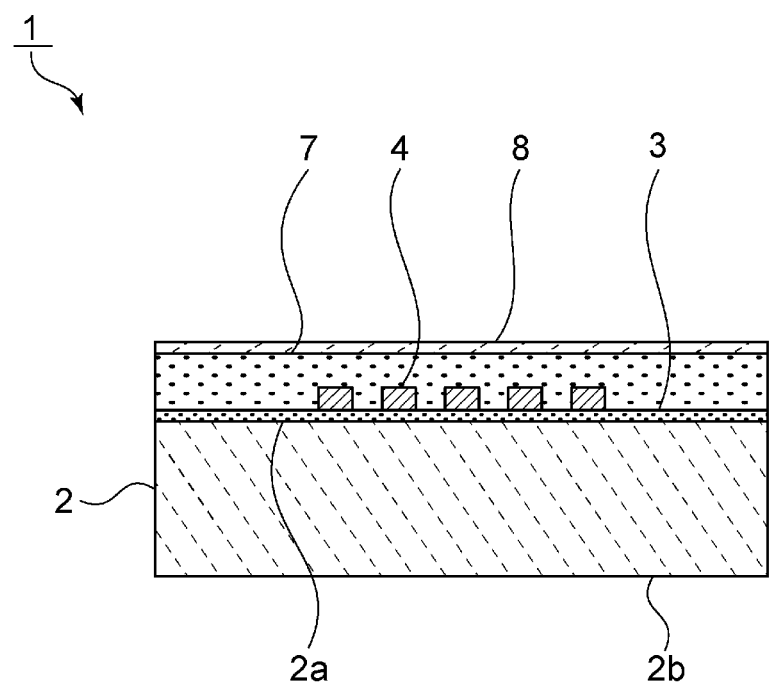
FIG. 1A is a schematic elevational cross-sectional view of an elastic wave device according to a first preferred embodiment of the present invention.

FIG. 1A is a schematic elevational cross-sectional view of an elastic wave device according to a first preferred embodiment of the present invention. An elastic wave device 1 includes a piezoelectric substrate 2. The piezoelectric substrate 2 includes first and second principal surfaces 2a and 2b. A first dielectric film 3 is disposed on the first principal surface 2a of the piezoelectric substrate 2. An IDT electrode 4 is laminated on the first dielectric film 3.

As the piezoelectric substrate 2, a substrate made of a piezoelectric single crystal, such as lithium tantalate ($LiTaO_3$) or lithium niobate ($LiNbO_3$), can be used. As the piezoelectric substrate 2, a substrate made of piezoelectric ceramics can also be used. Here, resistivity of the piezoelectric substrate 2 is equal to or lower than resistivity of the first dielectric film 3. Accordingly, in cases where static electricity is generated, the static electricity is able to be discharged to the piezoelectric substrate 2 side.

The piezoelectric substrate 2 may preferably be obtained by dividing a wafer subjected to a reduction process. In the case where the piezoelectric substrate 2 is a substrate subjected to the reduction process, its resistivity is lower than that in the case where it is not the substrate subjected to the reduction process. Because the piezoelectric substrate in the present preferred embodiment is subjected to the reduction process, it has a lower resistivity, as described above, and the static electricity is able to be more effectively discharged to the piezoelectric substrate 2 side.

The resistivity of the first dielectric film 3 in a preferred embodiment of the present invention preferably is equal to or lower than about $1\times10^{14}$ Ω·cm, for example. In contrast to this, in the case where a traditional dielectric material, for example, silicon oxide, is used, the resistivity is approximately $1\times10^{15}$ to $10^{16}$ Ω·cm. Accordingly, the resistivity of the first dielectric film 3 according to a preferred embodiment of the present invention is lower than that in the traditional case. The resistivity of the piezoelectric substrate 2 preferably is about $1\times10^{7}$ to $1\times10^{13}$ Ω·cm in an example case where the piezoelectric substrate 2 is made of LiNbO$_3$ subjected to the reduction process.

That is, the resistivity of the first dielectric film 3 in a preferred embodiment of the present invention is nearer to the resistivity of the piezoelectric substrate 2 than that made of the traditional dielectric material. Accordingly, if static electricity is generated in a manufacturing step or the like, the static electricity is able to be discharged to the piezoelectric substrate 2 side more easily. In a preferred embodiment of the present invention, the resistivity of the first dielectric film 3 may preferably be in the range of about $1\times10^{12}$ to about $1\times10^{14}$ Ω·cm, for example.

The material of the first dielectric film 3 is not particularly limited, and it can be a dielectric material doped with an impurity. As that dielectric material, any appropriate material, such as silicon oxide, silicon nitride, silicon oxynitride, aluminum nitride, tantalum oxide, titanium oxide, and aluminum oxide, may be used. Examples of the impurity may include boron (B) and phosphorus (P). In the case where the first dielectric film 3 is made of the dielectric material doped with the impurity, its resistivity is much nearer to the resistivity of the piezoelectric substrate 2. Preferably, the material of the first dielectric film 3 may be a material in which a dielectric material of a second dielectric film 7 described below is doped with the impurity. In that case, the manufacturing step can be simplified.

In the present preferred embodiment, the IDT electrode 4 is made of a metal film in which nickel-chrome (NiCr), platinum (Pt), titanium (Ti), aluminum-copper (AlCu), and titanium (Ti) are laminated in this order from below. The IDT electrode 4 can be made of an appropriate metal material, for example, aluminum (Al), copper (Cu), platinum (Pt), gold (Au), silver (Ag), titanium (Ti), nickel (Ni), chromium (Cr), molybdenum (Mo), tungsten (W), or an alloy whose principal component is any one of these metals. The IDT electrode 4 is not particularly limited. Like in the present preferred embodiment, a structure in which a plurality of metal films made of any of these metals or alloys are laminated may be used.

Figure 1B:
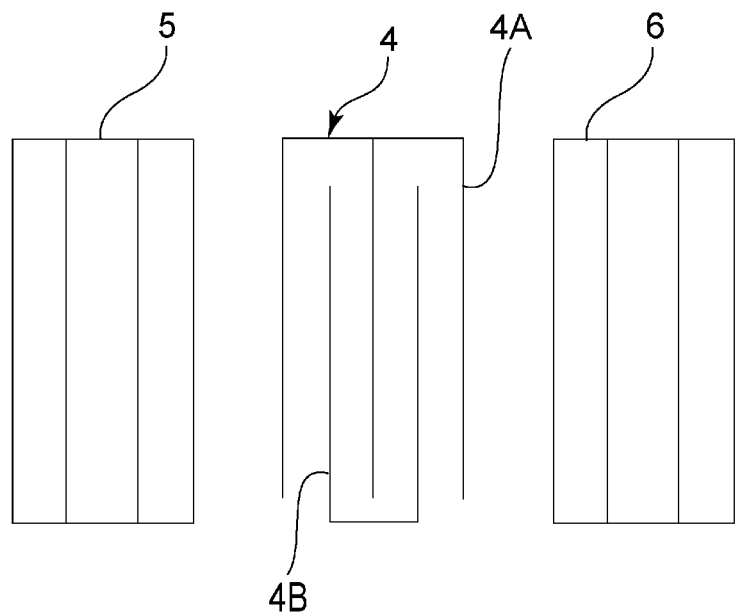
FIG. 1B is a schematic plan view that illustrates an electrode structure thereof.

Although schematically illustrated in FIG. 1A, an electrode structure illustrated in FIG. 1B is disposed on the piezoelectric substrate 2. That is, the IDT electrode 4 and reflectors 5 and 6 arranged on opposite sides in a propagation direction of the surface acoustic wave of the IDT electrode 4 are disposed and define a one-port surface acoustic wave resonator. The electrode structure including the IDT electrode in the present invention is not particularly limited. A combination of a plurality of resonators may define a filter. Examples of such a filter may include a ladder filter, longitudinally coupled resonator-type filter, and lattice filter.

The IDT electrode 4 includes two comb-shaped electrodes 4A and 4B. Each of the comb-shaped electrodes 4A and 4B includes a plurality of electrode fingers. The electrode fingers in the comb-shaped electrode 4A and the electrode fingers in the comb-shaped electrode 4B interlock with each other.

In a preferred embodiment of the present invention, the electromechanical coupling coefficient of an elastic wave excited by the IDT electrode 4 is able to be adjusted by adjustment of the thickness or composition of the first dielectric film 3.

In the first preferred embodiment, the IDT electrode 4 is covered with the second dielectric film 7. The second dielectric film 7 is disposed on the first dielectric film 3. The presence of the second dielectric film 7 leads to improvement in the temperature characteristics. In addition, the resistivity of the first dielectric film 3 is lower than the resistivity of the second dielectric film 7. Accordingly, in cases where static electricity is generated, the static electricity is able to be discharged to the piezoelectric substrate 2 side through the first dielectric film 3.

The material of the second dielectric film 7 is not particularly limited. As that material, silicon oxide, silicon nitride, silicon oxynitride, aluminum nitride, tantalum oxide, titanium oxide, and aluminum oxide, can be used. As described above, the material of the first dielectric film 3 may preferably be the material in which the dielectric material of the second dielectric film 7 is doped with the impurity. In that case, the first dielectric film 3 can have a resistivity lower than that of the second dielectric film 7 without significantly changing the manufacturing step.

A silicon nitride film 8 being a protective film is disposed on the second dielectric film 7. In a preferred embodiment of the present invention, the protective film is able to disposed as needed.

In the step of assembling the elastic wave device 1, static electricity may be generated by frictional charging or the like.

If a traditional elastic wave device is charged with static electricity, a potential difference arises between one comb-shaped electrode and the other comb-shaped electrode in the IDT electrode, and this may cause electrostatic breakdown.

In contrast to this, the elastic wave device 1 in the present preferred embodiment includes the first dielectric film 3 disposed between the piezoelectric substrate 2 and IDT electrode 4, as previously described. The resistivity of the piezoelectric substrate 2 is equal to or lower than the resistivity of the first dielectric film 3, and the resistivity of the first dielectric film 3 preferably is equal to or lower than about $1\times10^{14}$ Ω·cm, for example.

Thus, in the elastic wave device 1 according to the present preferred embodiment, the resistivity of the piezoelectric substrate 2 is reduced, and furthermore, the resistivity of the first dielectric film 3 is preferably near the resistivity of the piezoelectric substrate 2. Therefore, in cases where static electricity is generated by frictional charging or the like, it is able to be discharged to the piezoelectric substrate 2 side. That is, because charging the IDT electrode 4 with static electricity is able to be reduced, electrostatic breakdown is less likely to occur in the IDT electrode 4.

In a preferred embodiment of the present invention, in a region where the electrode fingers in one comb-shaped electrode and the electrode fingers in the other comb-shaped electrode in the IDT electrode are engaged with each other, the first dielectric film may be positioned at least directly under the electrode fingers. Accordingly, as in a variation of the first preferred embodiment illustrated in FIG. 2, the first dielectric film 3 may be disposed only directly under the electrode fingers in the IDT electrode 4.

Figure 2:
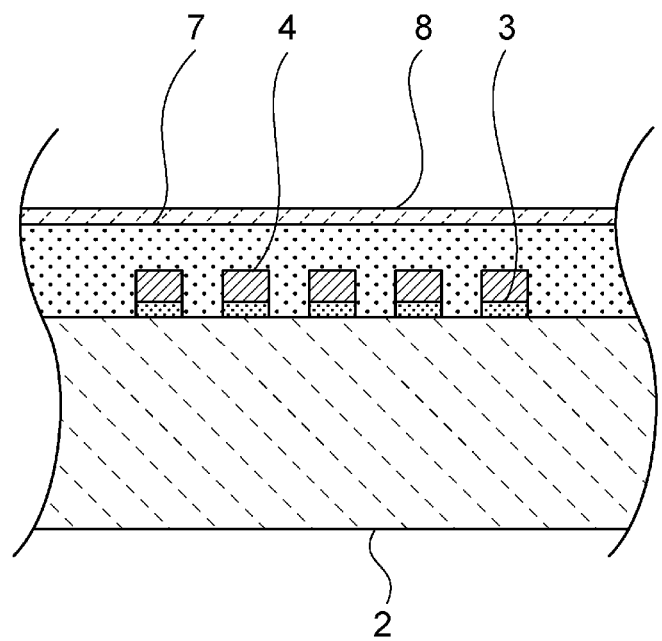
FIG. 2 is a partially cutaway cross-sectional view that illustrates a main portion in the elastic wave device according to a variation of the first preferred embodiment of the present invention.

In the variation of the first preferred embodiment illustrated in FIG. 2, the first dielectric film 3 and IDT electrode 4 are laminated in this order on the piezoelectric substrate 2. The first dielectric film 3 is disposed only directly under the electrode fingers in the IDT electrode 4. In addition, the second dielectric film 7 is disposed on the piezoelectric substrate 2 so as to cover the above first dielectric film 3 and IDT electrode 4.

Figure 3:
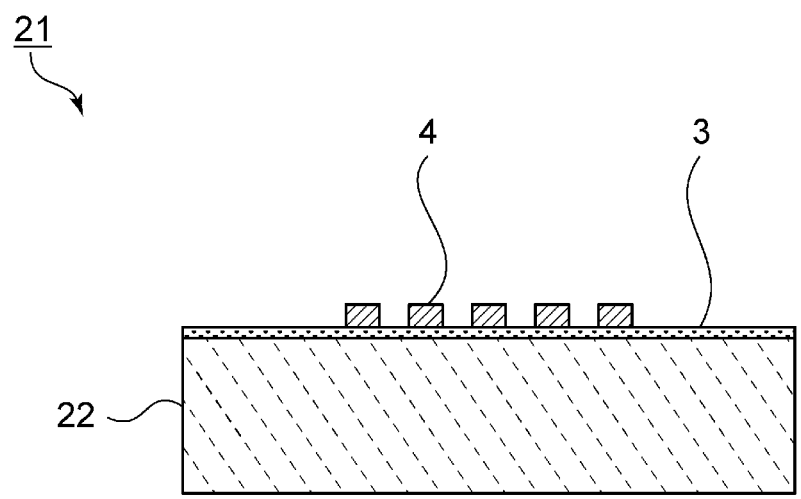
FIG. 3 is a schematic elevational cross-sectional view of an elastic wave device according to a second preferred embodiment of the present invention.

FIG. 3 is a schematic elevational cross-sectional view of an elastic wave device 21 according to a second preferred embodiment of the present invention. In the second preferred embodiment, the second dielectric film and silicon nitride film are not disposed. The other respects are the same as in the first preferred embodiment.

In the elastic wave device 21 in the second preferred embodiment, the first dielectric film 3 and IDT electrode 4 are laminated in this order on a piezoelectric substrate 22. That is, the first dielectric film 3 is disposed between the piezoelectric substrate 22 and IDT electrode 4. The resistivity of the above piezoelectric substrate 22 is equal to or lower than the resistivity of the first dielectric film 3, and the resistivity of the first dielectric film 3 is equal to or lower than about $1 \times 10^{14}$ Ω·cm, for example.

Thus, in the second preferred embodiment, the resistivity of the first dielectric film 3 is made near to the resistivity of the piezoelectric substrate 22. Accordingly, in cases where static electricity is generated, the static electricity is able to be discharged to the piezoelectric substrate side. Therefore, the electrostatic breakdown of the IDT electrode is significantly reduced.

In this configuration, the first dielectric film 3 may be disposed at least directly under the electrode fingers in the IDT electrode 4. This is because such an arrangement enables static electricity to be discharged to the piezoelectric substrate 22 side.

Figure 4:
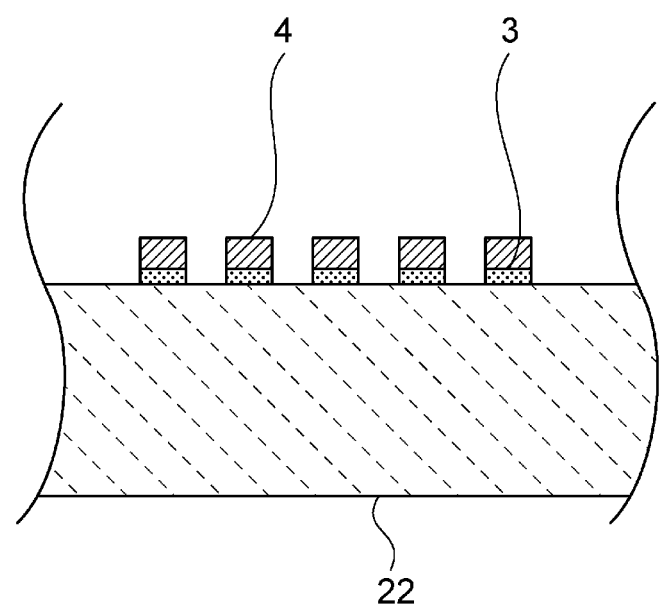
FIG. 4 is a partially cutaway cross-sectional view that illustrates a main portion in the elastic wave device according to a variation of the second preferred embodiment of the present invention.

Accordingly, advantages of preferred embodiments of the present invention can also be achieved by the adoption of the structure in which the first dielectric film 3 is disposed only directly under the electrode fingers in the IDT electrode 4 as in a variation of the second preferred embodiment illustrated in FIG. 4.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave apparatus comprising:
a piezoelectric substrate;
a first dielectric film disposed on the piezoelectric substrate; and
an interdigital transducer (IDT) electrode laminated on the first dielectric film; wherein resistivity of the piezoelectric substrate is equal to or lower than resistivity of the first dielectric film, and the resistivity of the first dielectric film is equal to or lower than about $1 \times 10^{14}$ Ω·cm.

2. The elastic wave device according to claim 1, further comprising a second dielectric film that covers a periphery of the IDT electrode.

3. The elastic wave device according to claim 2, wherein the resistivity of the first dielectric film is lower than resistivity of the second dielectric film.

4. The elastic wave device according to claim 1, wherein the first dielectric film is disposed only directly under the IDT electrode.

5. The elastic wave device according to claim 1, wherein the first dielectric film is doped with an impurity.

6. The elastic wave device according to claim 5, wherein the impurity is boron or phosphorus.

7. The elastic wave device according to claim 2, wherein the first dielectric film is made of a material doped with an impurity and a material of the second dielectric film is doped with the impurity.

8. The elastic wave device according to claim 1, wherein the piezoelectric substrate is made of a material subjected to a reduction process.

9. The elastic wave device according to claim 1, wherein the piezoelectric substrate is made of one of piezoelectric single crystal and a piezoelectric ceramic.

10. The elastic wave device according to claim 1, wherein the resistivity of the first dielectric film is in a range of about $1 \times 10^{12}$ to about $1 \times 10^{14}$ Ω·cm.

11. The elastic wave device according to claim 1, wherein the first dielectric film is made of one of silicon oxide, silicon nitride, silicon oxynitride, aluminum nitride, tantalum oxide, titanium oxide, and aluminum oxide.

12. The elastic wave device according to claim 1, wherein the IDT electrode includes nickel-chrome, platinum, titanium, aluminum-copper, and titanium in this order.

13. The elastic wave device according to claim 1, wherein the IDT electrode is made of at least one of aluminum, copper, platinum, gold, silver, titanium, nickel, chromium, molybdenum, tungsten, and an alloy thereof.

14. The elastic wave device according to claim 1, further comprising reflectors provided on opposite ends of the piezoelectric substrate.

15. The elastic wave device according to claim 14, wherein the reflectors and the IDT electrode define a one-port surface acoustic wave resonator.

16. The elastic wave device according to claim 2, wherein the second dielectric film includes at least one of silicon oxide, silicon nitride, silicon oxynitride, aluminum nitride, tantalum oxide, titanium oxide, and aluminum oxide.

17. The elastic wave device according to claim 2, further comprising a protective film disposed on the second dielectric film.

18. The elastic wave device according to claim 17, wherein the protective film is a silicon nitride film.

* * * * *